United States Patent
Kang et al.

(10) Patent No.: US 7,734,880 B2
(45) Date of Patent: Jun. 8, 2010

(54) FLASH MEMORY SYSTEM COMPENSATING REDUCTION IN READ MARGIN BETWEEN MEMORY CELL PROGRAM STATES

(75) Inventors: Sang-gu Kang, Suwon-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 444 days.

(21) Appl. No.: 11/595,925

(22) Filed: Nov. 13, 2006

(65) Prior Publication Data

US 2007/0171722 A1     Jul. 26, 2007

(30) Foreign Application Priority Data

Jan. 24, 2006    (KR)    ...................... 10-2006-0007414

(51) Int. Cl.
*G06F 12/00* (2006.01)
*G06F 13/00* (2006.01)
*G06F 13/28* (2006.01)
*G11C 16/04* (2006.01)
*G11C 16/06* (2006.01)

(52) U.S. Cl. ........................ 711/154; 711/103; 711/163; 711/167; 365/185.18; 365/185.33

(58) Field of Classification Search .................. 711/103
See application file for complete search history.

(56) References Cited

U.S. PATENT DOCUMENTS

| | | | |
|---|---|---|---|
| 6,925,012 B2 | 8/2005 | Yamagami et al. | |
| 7,020,017 B2* | 3/2006 | Chen et al. | 365/185.03 |
| 7,196,946 B2* | 3/2007 | Chen et al. | 365/189.07 |
| 2001/0015905 A1* | 8/2001 | Kim et al. | 365/51 |

* cited by examiner

*Primary Examiner*—Christian P Chace
*Assistant Examiner*—Ryan Bertram
(74) *Attorney, Agent, or Firm*—Volentine & Whitt, PLLC

(57) ABSTRACT

A memory system includes a flash memory and a memory controller configured to control the flash memory. The memory controller determines whether program data provided from a host are all stored in the flash memory during a program operation. When the determination result is that the program data are all stored in the flash memory, the memory controller controls the flash memory to execute a dummy program operation for the next wordline of a final wordline in which the program data are stored.

10 Claims, 9 Drawing Sheets

US 7,734,880 B2

FLASH MEMORY SYSTEM COMPENSATING REDUCTION IN READ MARGIN BETWEEN MEMORY CELL PROGRAM STATES

BACKGROUND OF THE INVENTION

1. Field of the Invention

Embodiments of the invention relate to a flash memory system. More particularly, embodiments of the invention relate to a flash memory system capable of compensating for reduced read margins between memory cell program states.

This U.S. non-provisional patent application claims priority under 35 U.S.C §119 of Korean Patent Application 2006-07414 filed on Jan. 24, 2006, the entire contents of which are hereby incorporated by reference.

2. Discussion of Related Art

In recent years, storage devices such as volatile memory devices and non-volatile memory devices have been increasingly applied to MP3 players and mobile appliances such as, for example, portable multimedia players (PMPs), cellular phones, notebook computers, and personal digital assistances (PDAs). The MP3 players and the mobile appliances require mass storage devices for offering various functions (e.g., moving picture playback). Many efforts have been made for meeting the requirement. One of these efforts is to propose a multi-bit memory device where at least 2-bit data are stored in one memory cell. Exemplary multi-bit memory devices are disclosed, for example, in U.S. Pat. Nos. 6,122,188; 6,075,734; and 5,923,587 which are incorporated herein by reference.

When 1-bit data is stored in one memory cell, the memory cell has a threshold voltage belonging to one of two threshold voltage distributions, i.e., the memory cell has one of two states indicating data "0" and data "1". On the other hand, when 2-bit data is stored in one memory cell, the memory cell has a threshold voltage belonging to one of four threshold voltage distributions, i.e., the memory cell has one of four states indicating data "11", data "10", data "00", and data "01". Threshold voltage distributions corresponding to four states are illustrated in FIG. 1.

Threshold voltage distributions corresponding to four states should be carefully controlled such that each of the threshold voltage distributions exists within a determined threshold voltage window. In order to achieve this, a programming method using an increment step pulse programming (ISPP) scheme has been suggested. In the ISPP scheme, a threshold voltage shifts by the increment of a program voltage according to the repetition of program loops. By setting the increment of a program voltage to a small value, threshold voltage distributions may be minutely controlled to secure a sufficient margin between states. Unfortunately, this leads to increase of time required for programming a memory cell to reach a desired state. Accordingly, the increment of the program voltage may be determined based on the programming time.

In spite of such an ISPP scheme, a threshold voltage distribution of each state is generated to be wider than a desired window due to various causes. For example, as indicated by dotted lines 10, 11, 12, and 13 of FIG. 1, a threshold voltage distribution is widened due to a coupling between adjacent memory cells in a programming operation. Such a coupling is called an "electric field coupling" or "F-poly coupling". For example, as illustrated in FIG. 2, assuming that a memory cell MCA is a cell programmed to have one of four states and a memory cell MCB is a cell programmed to have one of four states, charges are accumulated in a floating gate (FG) as the memory cell MCB is programmed. When memory cell MCB is programmed, a voltage of floating gate FG of adjacent memory cell MCA rises due to a coupling between floating gates FG of the memory cells MCA and MCB. The rising threshold voltage is maintained due to a coupling between floating gates even after programming memory cell MCB. The memory cell MCB includes memory cells arranged in a wordline direction and/or a bitline direction relative to the memory cell MCA. Due to such a coupling, the threshold voltage of the programmed memory cell MCA rises and the threshold voltage distributions are widened as indicated by the dotted lines 10, 11, 12, and 12 of FIG. 1. Accordingly, a margin between states is reduced, as illustrated in FIG. 1 which is a reduction of the read margin (difference in voltage in determining the presence of a "1" or a "0").

One conventional technique for preventing a threshold voltage distribution from being widened due to a coupling is disclosed in U.S. Pat. No. 5,867,429.

Not only an electric field coupling/F-poly coupling but also a read margin between states is reduced as threshold voltages of memory cells drop with the lapse of time, which will be hereinafter referred to as "hot temperature stress (HTS)". HTS means that charges accumulated in a floating gate of a memory cell are drained to a substrate. As the charges of the floating gate are reduced, threshold voltages of memory cells in respective states drop, as indicated by dotted lines 20, 21, and 22 of FIG. 3. Accordingly, a threshold voltage increases due to an electric field coupling/F-poly coupling and a threshold voltage decreases due to HTS which makes it difficult to secure a read margin between states. In particular, it is difficult to know a state of the programmed memory cell. This problem becomes severe with the recent trend toward more complex semiconductor fabrication processes.

Accordingly, there is a need for securing a read margin between states even if a threshold voltage increases due to an electric field coupling/F-poly coupling and a threshold voltage decreases due to HTS.

SUMMARY OF THE INVENTION

Exemplary embodiments of the present invention are directed to a memory system. In an exemplary embodiment, the memory system may include a flash memory; and a memory controller configured to control the flash memory. The memory controller determines whether program data provided from a host are all stored in the flash memory during a program operation. When the determination result is that the program data are all stored in the flash memory, the memory controller controls the flash memory to execute a dummy program operation for the next wordline of a final wordline in which the program data are stored.

DESCRIPTION OF EMBODIMENTS

Figure 1:
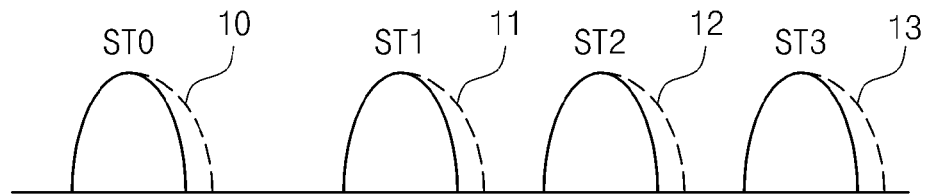
FIG. 1 illustrates widened threshold voltage distributions associated with electric field coupling/F-poly coupling.
Figure 2:
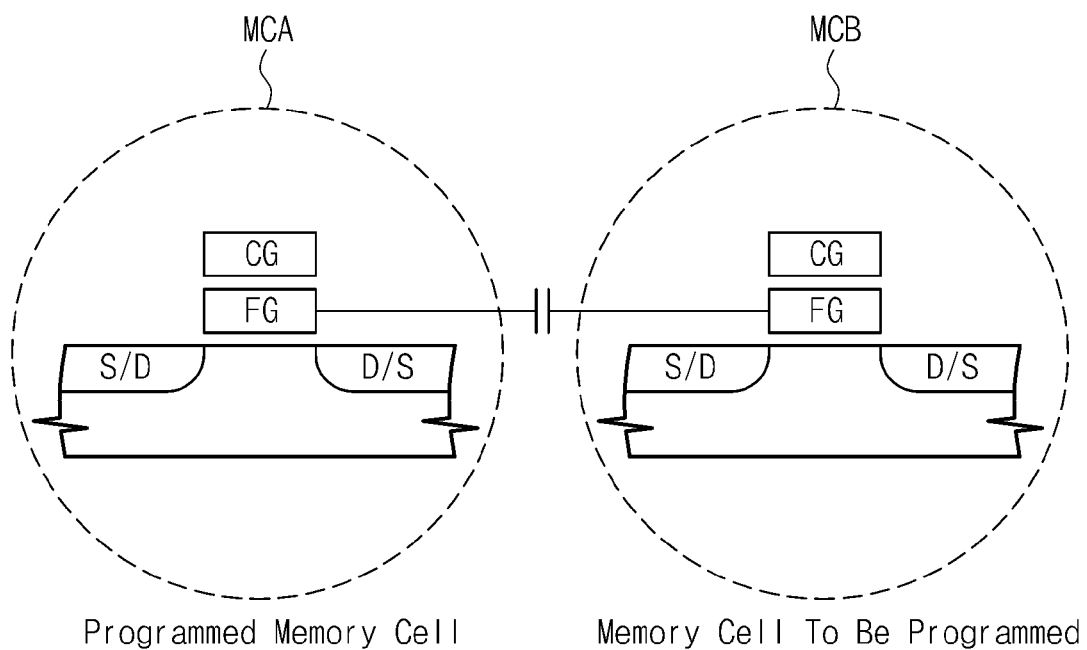
FIG. 2 illustrates an electric field coupling/F-poly coupling generated between memory cells.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 4:
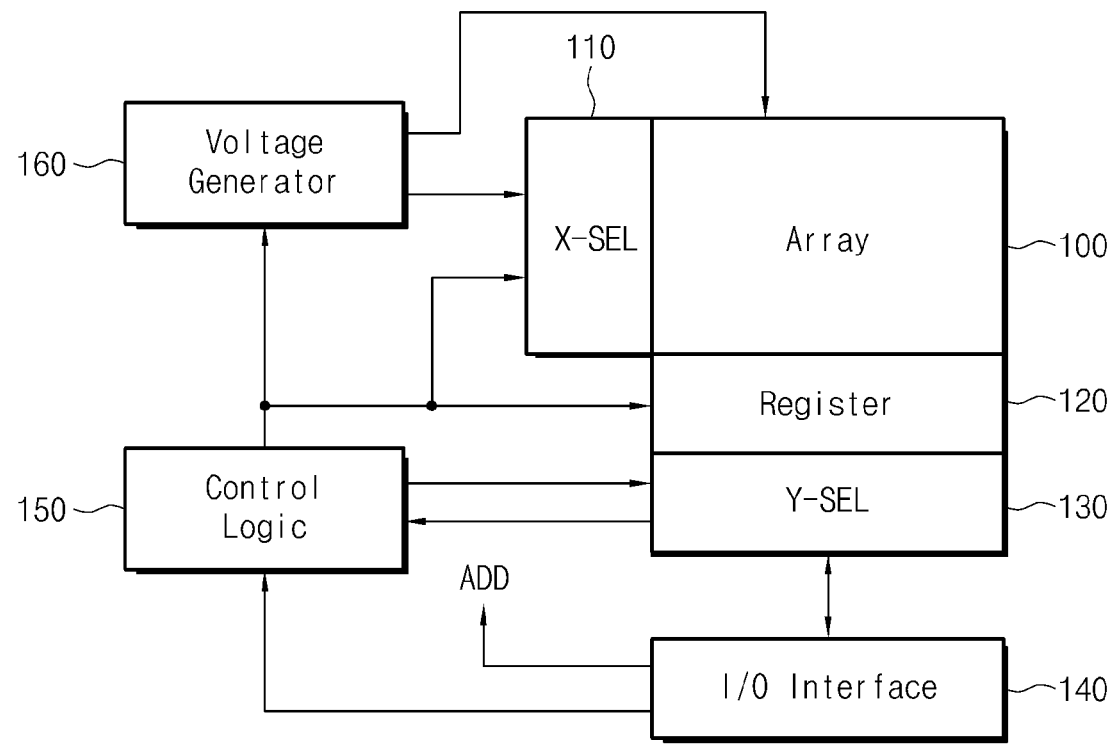
FIG. 4 is a block diagram of a flash memory device according to the present invention.

FIG. 4 is a block diagram of a flash memory device according to an embodiment of the present invention which comprises a memory cell array 100 for storing data information. The memory cell array 100 includes a plurality of memory blocks each having a memory cell configuration illustrated in FIG. 5.

Figure 5:
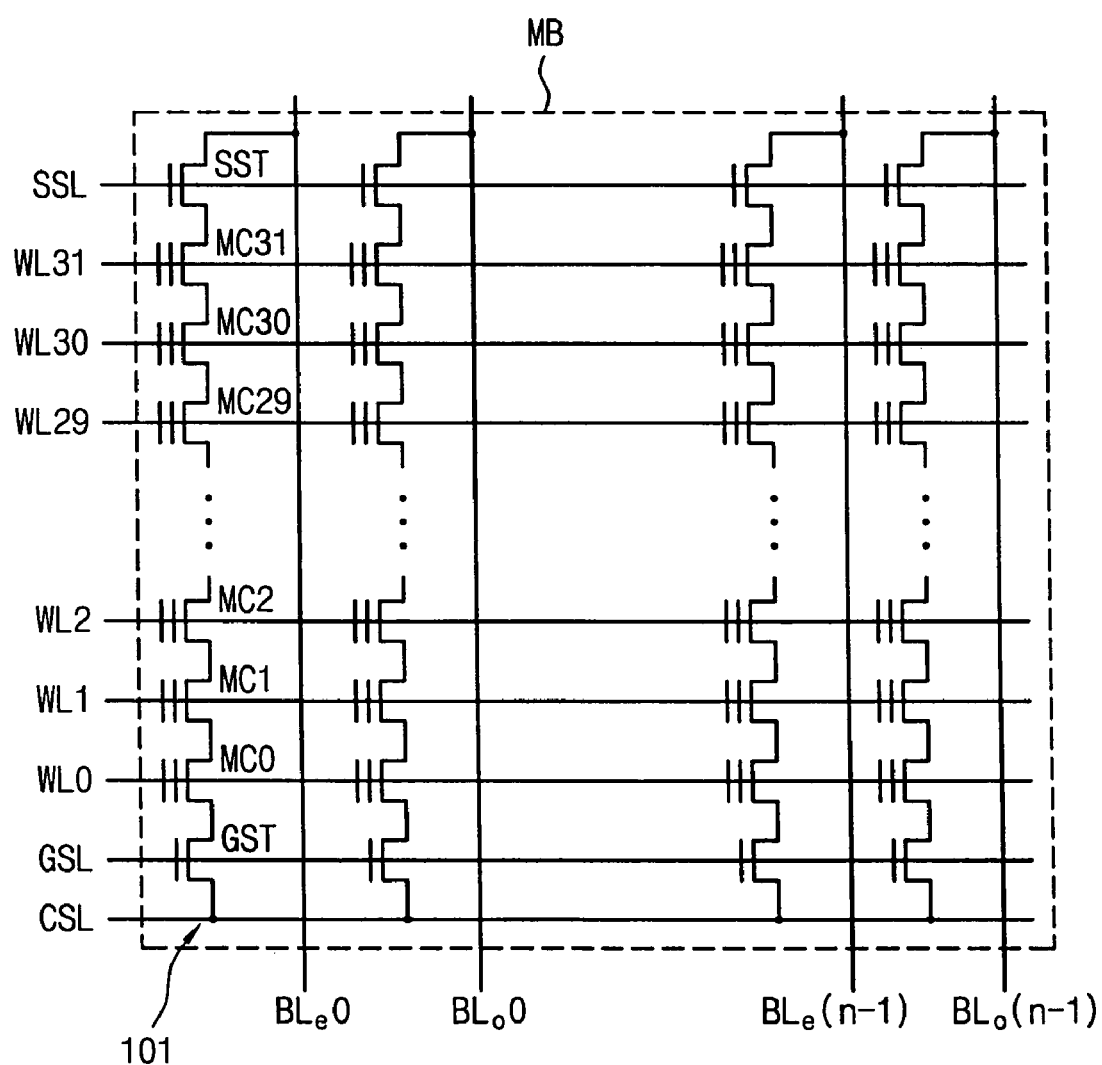
FIG. 5 is a circuit diagram of a memory cell array illustrated in FIG. 4.

FIG. 5 is a circuit diagram of a memory cell array illustrated in FIG. 4 comprising a memory block MB that includes a plurality of strings 101 each having a string select transistor SST, a ground select transistor GST, and memory cells MC31-MC0. The string selection transistor SST is controlled by a string select line SSL and has a drain connected to a corresponding bitline. The memory cells MC31-MC0 are serially coupled between a source of the string select transistor SST and a drain of the ground select transistor GST and controlled by corresponding wordlines WL31-WL0, respectively. It will be understood by those skilled in the art that the number of wordlines is not limited thereto. Each memory cell will be comprised of a floating gate transistor.

Returning to FIG. 4, a row selector circuit (X-SEL) 100 is controlled by a control logic 150. The row selector circuit 100 selects one of the memory blocks in response to an address (ADD) provided through an input/output interface (I/O) 140 which controls rows (including wordlines and select lines) of the selected memory block. A register block 120 is controlled by the control logic 150 and functions as a sense amplifier or a write driver according to an operation mode. Although not illustrated in this figure, the register block 120 may be comprised of page buffers. Each of the page buffers is electrically connected to one bitline or one of a pair of bitlines and reads data from a memory cell or stores data in the memory cell through a bitline.

A column selector circuit (Y-SEL) 130 is controlled by the control logic and outputs data stored in the register block 120 to the I/O interface 140 or the control logic 150 in response to the address ADD provided through the I/O interface 140. For example, in a normal read operation, the column selector circuit 130 outputs data stored in the register block 120 to the I/O interface 140. In a verify normal read operation, the column selector circuit 130 outputs data stored in the register block 120 to the control logic 150 and the control logic 150 judges whether the data provided from the column selector circuit 130 is pass data. During a data loading period of a program operation, the column selector circuit 130 outputs program data transferred through the I/O interface 140 to the register block 120. The control logic 150 is configured to control general operations of a flash memory device. A voltage generator 160 is controlled by the control logic 150 and configured to generate voltages (e.g., a wordline voltage, a bulk voltage, a read voltage, a pass voltage, etc.) required for program/erase/read operations.

As described below, a flash memory device according to an aspect of the present invention adopts a novel program technology for sufficiently securing a read margin between states even if memory cells are subjected to an electric field coupling/F-poly coupling and HTS. In accordance with the programming of the present invention, 2-bit data is stored in respective memory cells of a selected page so that memory cells are programmed using target threshold voltages of respective desired states. This is hereinafter referred to as a "first program operation". After the first program operation is completed, read operations are executed to detect memory cells arranged within a predetermined threshold voltage region among the memory cells of the respective states. The detected memory cells are programmed to have a higher threshold voltage than target threshold voltages of the respective states. This is hereinafter referred to as a "second program operation".

The first program operation for storing 2-bit data varies with the configuration of the register block 120. For example, after loading both LSB and MSB data bits on the register block 120, the first program operation may be executed. Alternatively, programming MSB data bit (hereinafter referred to as "MSB program operation") may be followed by programming LSB data bit (hereinafter referred to as "LSB program operation"). The latter program method, as an exemplary program method, will now be described in brief with reference to FIG. 6A and FIG. 6B.

Figure 6A:
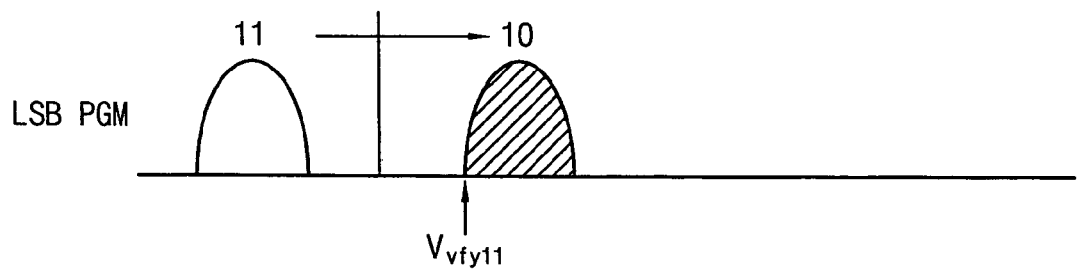
FIG. 6A and FIG. 6B illustrate a multi-bit program operation according to the present invention.
Figure 6B:
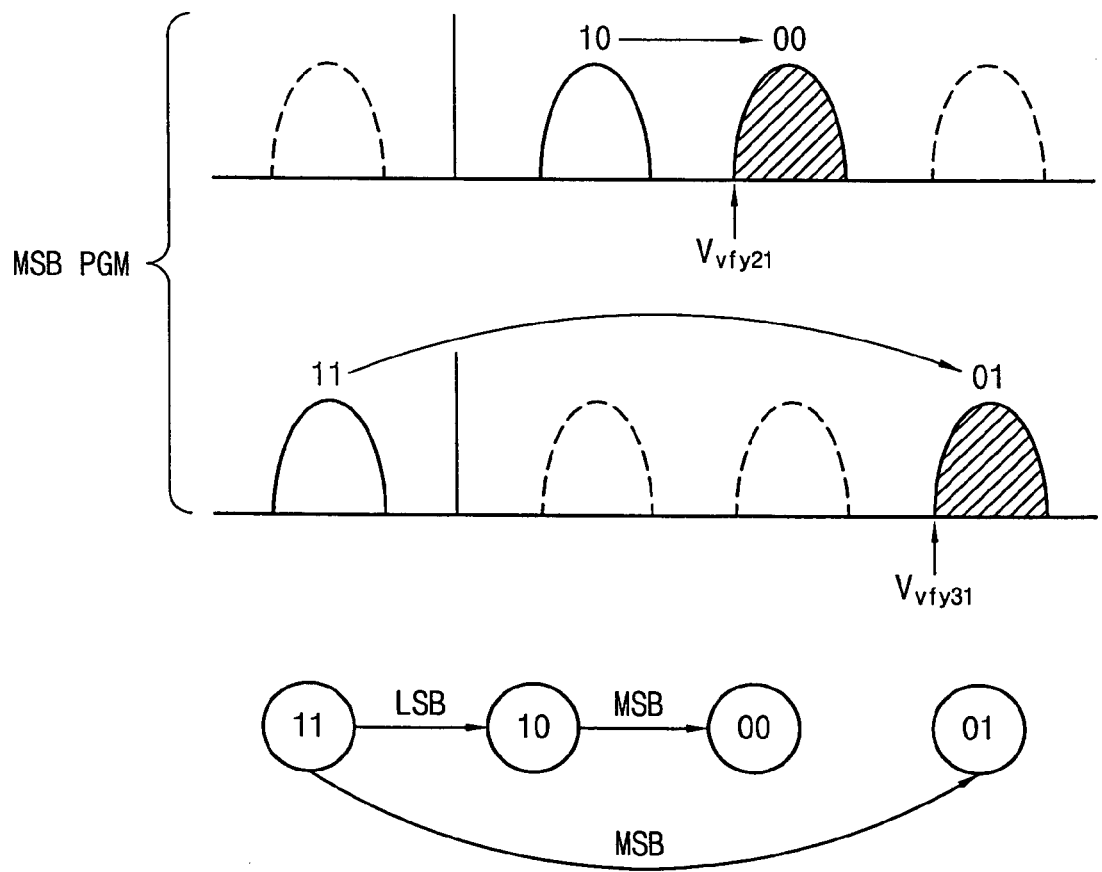

One memory cell is programmed to have one of "11", "10", "00", and "01" states. For the convenience of description, it is assumed that the "11", "10", "00", and "01" states correspond to ST0, ST1, ST2, and ST3, respectively. A memory cell having the "11" state is an erased memory cell, and a threshold voltage of a memory cell having the "10" state is higher than that of the memory cell having the "11" state. A threshold voltage of a memory cell having the "00" state is higher than that of a memory cell having the "10" state. Further, a threshold voltage of a memory cell having the "01" state is higher than that of a memory cell having the "00" state. If an LSB program operation is executed under the foregoing condition, a memory cell has an erased state or a "10" state, as illustrated in FIG. 6A. If an MSB program operation is executed following the LSB program operation, a memory cell having the "11" state has an erased state or a "01" state while a memory cell having the "10" state has a "10" or "00" state, as illustrated in FIG. 6B.

In the present invention, two program operations are executed when any wordline is selected. More specifically, a program operation for memory cells connected to the selected wordline and even-number bitlines BLe0-BLe(n−1) is followed by a program operation for memory cells connected to the selected wordline and odd-number bitlines BLo0-BLo(n−1). For the convenience of description, a program operation according to the invention will be described according to the above order. However, it will be understood by those skilled in the art that a program operation for memory cells connected to the selected wordline and odd-number bitlines BLo0-BLo(n−1) may be followed by a program operation for memory cells connected to the selected wordline and even-number bitlines BLe0-BLe(n−1).

Figure 7:
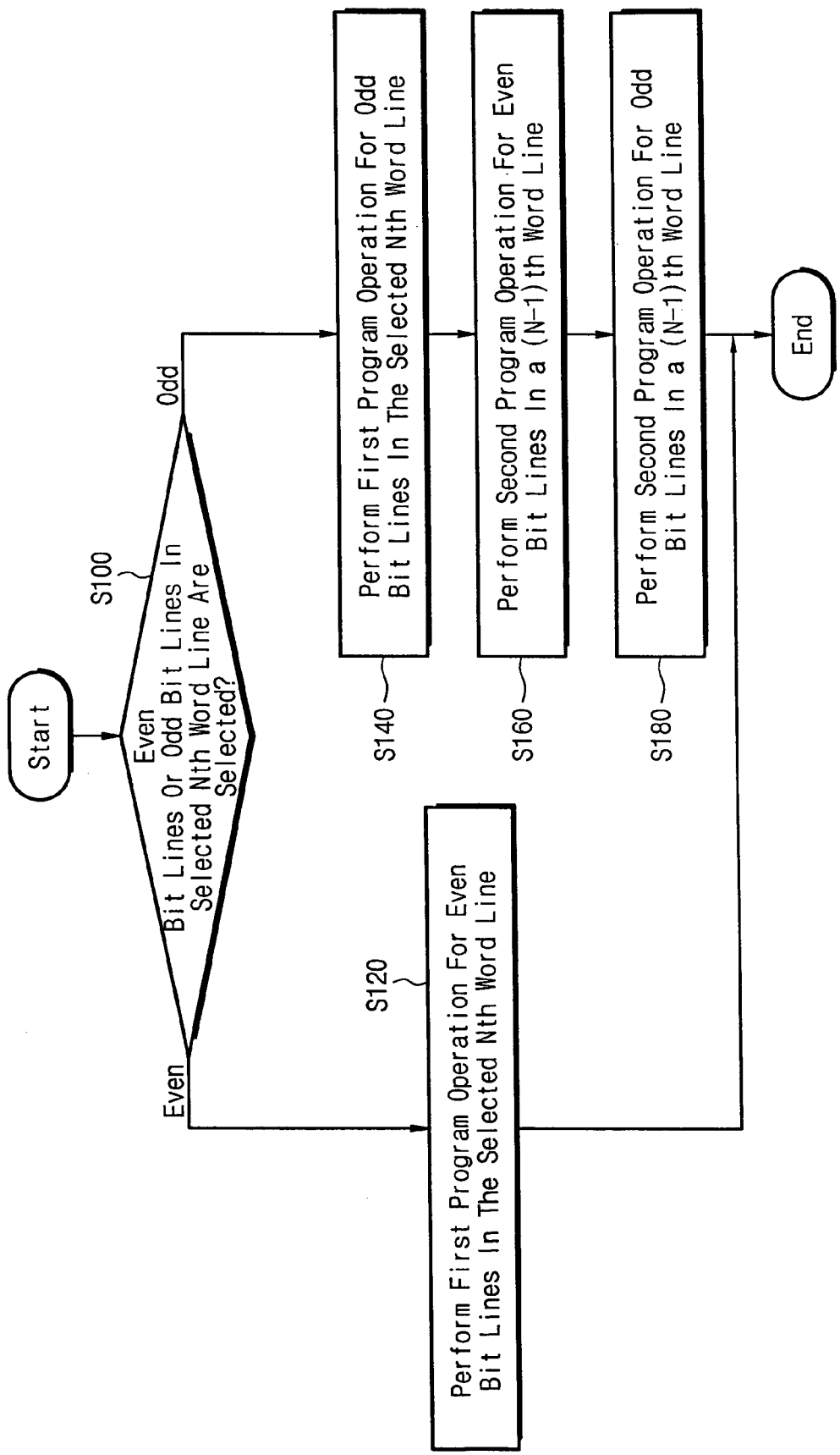
FIG. 7 is a flowchart illustrating a program method of a flash memory device according to an embodiment of the present invention.

FIG. 7 is a flowchart illustrating a programming method of a flash memory device in accordance with an embodiment of the present invention. When a program operation starts, control logic 150 determines, in step S100, whether even-number bitlines BLe0-BLe(n−1) on a selected wordline (e.g., Nth wordline) are selected (S100). This determination is performed based on address information provided through an input/output interface (I/O interface) 140. When the even-number bitlines BLe0-BLe(n−1) are selected, the primary program operation for memory cells connected with the selected wordline WLn and the even-number bitlines BLe0-BLe(n−1) is executed by control logic 150 in step (S110). While the primary program operation is executed, the selected memory cells are programmed to one of states ST1, ST2, and ST3 shown in FIG. 9, respectively. Based on verify voltages Vvfy11, Vvfy12, and Vvfy13 corresponding to the states ST1, ST2, and ST3, it is determined whether the memory cells are programmed to the respective states. For example, the verify voltage Vvfy11 is used to determine whether a memory cell is programmed to the state ST1; the verify voltage Vvfy12 is used to determine whether a memory cell is programmed to the state ST2; and the verify voltage Vvfy13 is used to determine whether a memory cell is programmed to the state ST3. Once these states are verified, the primary program procedure is ended.

When the odd-number bitlines BLo0-BLo(n−1) are selected, as determined at step S100, the primary program operation for memory cells connected with the selected wordline WLn and the odd-number bitlines BLo0-BLo(n−1) is executed by control logic 150 at step S120. The primary program operation is executed as described above. Once, the program operation for memory cells connected with the selected wordline WLn and the odd-number bitlines BLo0-BLo(n−1) is ended, a program operation (i.e., secondary program operation) for a wordline WL(n−1) directly below the selected wordline WLn is executed. First, a secondary program operation (or reprogram operation) is executed for memory cells connected with the wordline WL(n−1) and the odd-number bitlines BLo0-BLo(n−1) at step S160. Thereafter, a secondary program operation (or reprogram operation) is executed for memory cells connected with the wordline WL(n−1) and the odd-number bitlines BLo0-BLo(n−1) (S180). As will be described later, memory cells arranged within a predetermined region among threshold voltage regions of the respective states are reprogrammed by a secondary program operation to have a higher threshold voltage. Unlike the description with reference to FIG. 7, the secondary program operation for memory cells connected with the wordline WL(n−1) and the odd-number bitlines BLo0-BLo(n−1) may be followed by a secondary program operation for memory cells connected with the wordline WL(n−1) and the even-number bitlines BLe0-BLe(n−1).

Figure 8A:
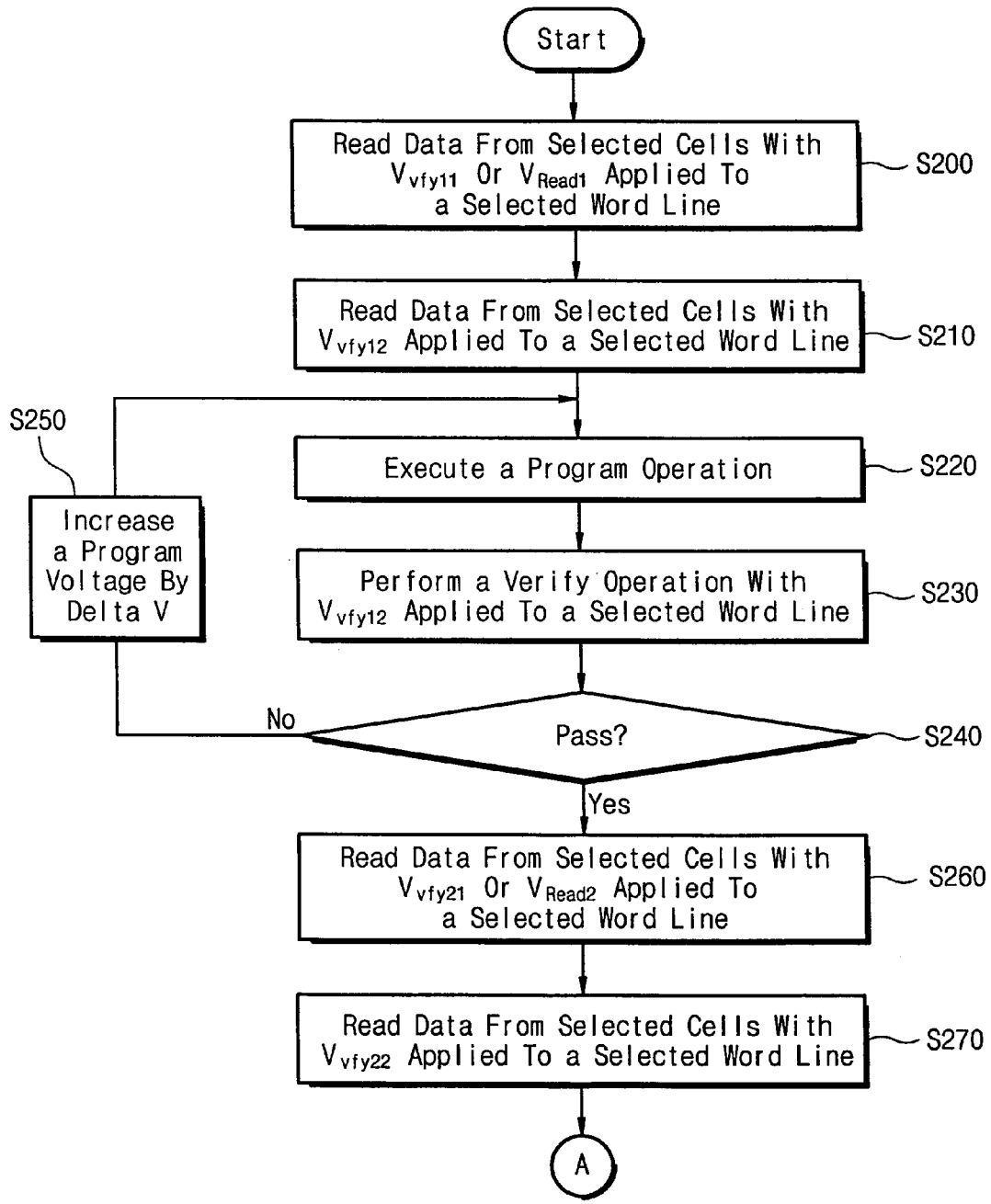
FIG. 8 is a flowchart illustrating a secondary program method shown in FIG. 7.
Figure 8B:
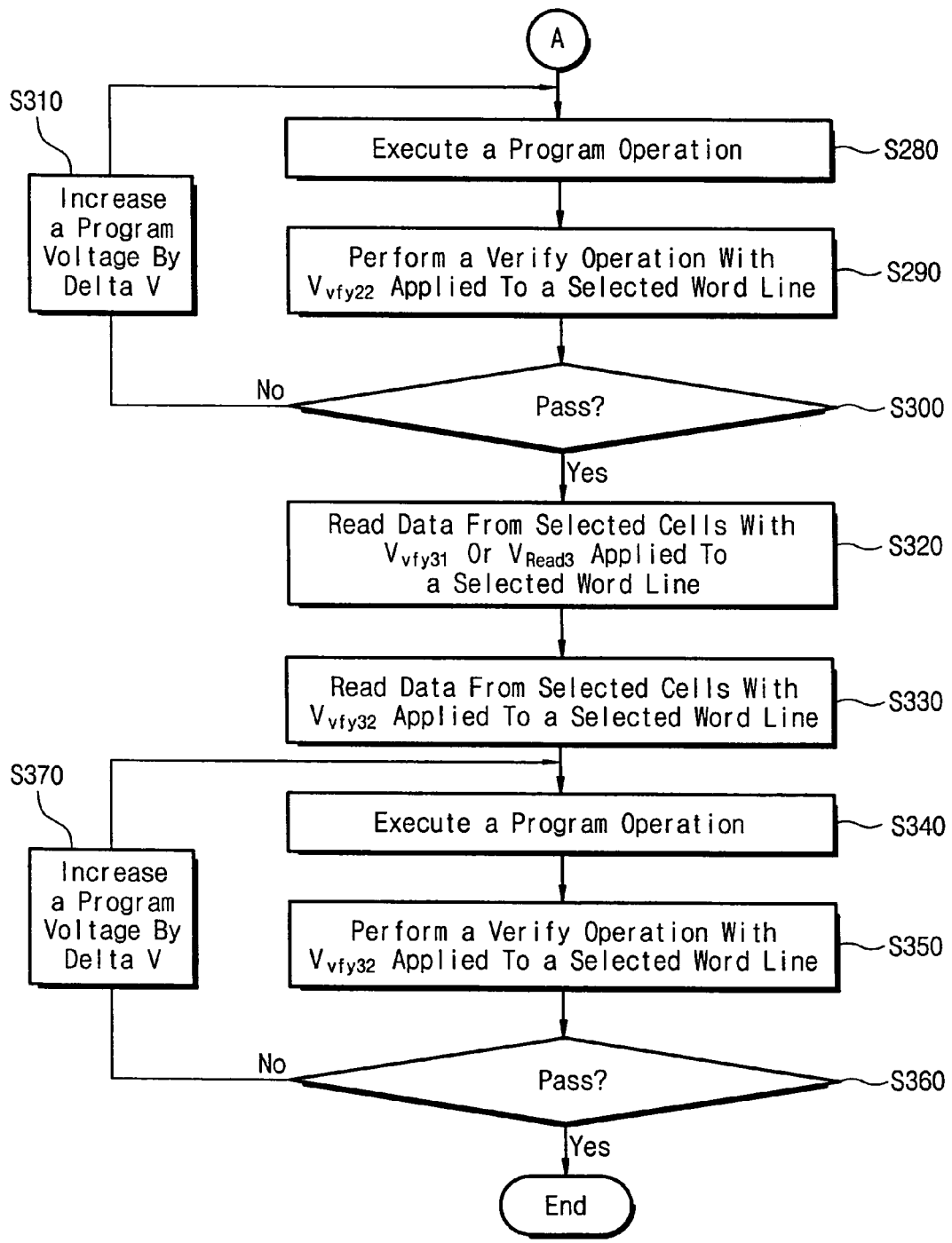
Figure 9:
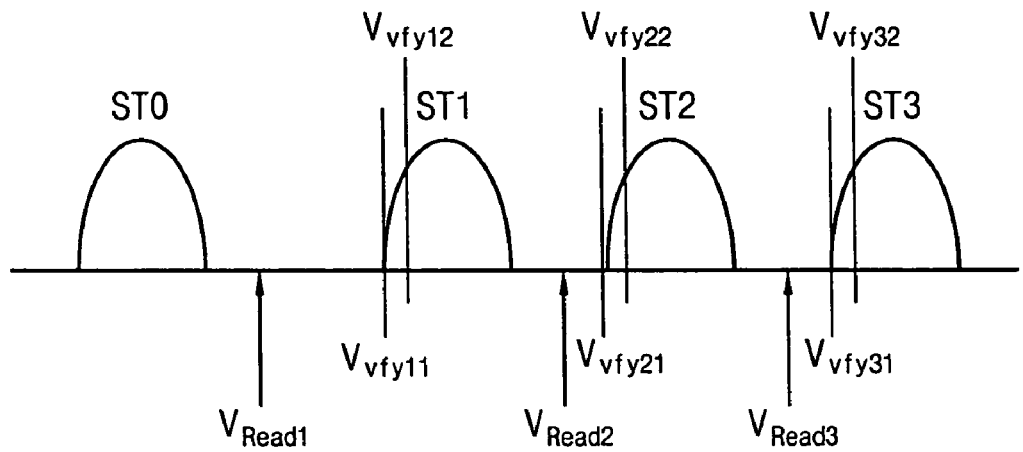
FIG. 9 illustrates verify voltages when executing a program operation of a flash memory device according to the present invention.

FIG. 8 is a flowchart illustrating the secondary program of a flash memory device in accordance with the present invention. FIG. 9 illustrates the verify voltages when executing the program operation of a flash memory device according to the present invention.

As described with reference to FIG. 7, if a primary program operation for 2-bit data is completed, a second program operation is executed for memory cells connected with a wordline WL(n−1) disposed directly below a selected wordline WLn. The secondary program operation for memory cells connected with the wordline WL(n−1) and even-number bitlines BLo0-BL0(n−1) will be described below. While a verify voltage Vvfy11 (or read voltage Vread1) is applied to a selected wordline WL(n−1), a read operation is executed through a register block 120. Thereafter, while a verify voltage Vvfy12 higher than the verify voltage Vvfy11 is applied to the selected wordline WL(n−1), a read operation is executed through register block 120 at step S200 shown in FIG. 8A. By executing the read operation twice in steps S200 and S210, memory cells having threshold voltages between verify voltages Vvfy11 and Vvfy12 (or a read voltage Vread1 and the verify voltage Vvfy12) (see FIG. 9) are detected. It will be understood by those skilled in the art that the method of detecting memory cells having threshold voltages between verify voltages Vvfy11 and Vvfy12 (or a read voltage Vread1 and the verify voltage Vvfy12) may vary with the configuration of the register block 120.

If the memory cells having the threshold voltages between the verify voltages Vvfy11 and Vvfy12 (or the read voltage Vread1 and the verify voltage Vvfy12 are detected, a program operation (i.e., secondary program operation) is executed to the detected memory cells at step S220. After the program operation is executed, a verify read operation is executed while the verify voltage Vvfy12 acting as a read voltage is applied to the selected wordline WL(n−1) at step S230. A determination is made at step S240 whether the detected memory cells are programmed to have a threshold voltage corresponding to the verify voltage Vvfy12 (S240). When the determination result is that all the detected memory cells are not programmed with a required threshold voltage, a program voltage to be applied to the selected wordline WL(n−1) increases by a predetermined increment at step S250 and the routine returns to step S220. The program loop from step S220 to step S250 repeats either a predetermined number of times or until all detected memory cells are programmed.

When the determination result is that all the detected memory cells are programmed with a required threshold voltage, the answer to step s240 is yes and the program proceeds to step S260 where a read operation is executed through the register block 120 while a verify voltage Vvfy21 (or a read voltage Vread2) is applied to the selected wordline WN(n−1). Thereafter, a read operation is executed through the register block 120 while a verify voltage vfy22, higher than the verify voltage Vvfy21, is applied to the selected wordline WL(n−1) at step S270. By executing the read operation twice at steps S260 and S270, memory cells having threshold voltages between the verify voltages Vvfy21 and Vvfy22 (or the read voltage Vread2 and the verify voltage Vvfy22) (see FIG. 9) are detected. If the memory cells having threshold voltages between the verify voltages Vvfy21 and Vvfy22 (or the read voltage Vread2 and the verify voltage Vvfy22) (see FIG. 9) are detected, a program operation (i.e., secondary program operation) is executed for the detected memory cells at step S280. After the program operation is executed, step S290 executes a verify read operation while the verify voltage Vvfy22, acting as a read voltage, is applied to the selected wordline WL(n−1). A determination is made at step S300 whether the detected memory cells are programmed to have a threshold voltage corresponding to the verify voltage Vvfy22 (S300). When the determination result is that all the detected memory cells are not programmed with a required threshold voltage, a program voltage to be applied to a selected wordline increases by a predetermined increment (S310). This routine returns to step S280, which is repeated until the program loop comprising the steps S280-S310 runs a predetermined number of times or the memory cells are all programmed with the required threshold voltage.

When the determination result is that all the detected memory cells are programmed with a required threshold voltage, a read operation is executed at step S320 through register block 120 while a verify voltage Vvfy31 (or a read voltage Vread3) is applied to the selected wordline WL(n−1). Thereafter, a read operation is executed through the register block 120 while a verify voltage Vvfy32 higher than the verify voltage Vvfy31 is applied to the selected wordline WL(n−1) (S330). By executing the read operation twice at steps S320 and S330, memory cells having threshold voltages between the verify voltages Vvfy31 and Vvfy32 (or the read voltage Vread3 and the verify voltage Vvfy32) (see FIG. 9) are detected. If the memory cells having threshold voltages between the verify voltages Vvfy31 and Vvfy32 (or the read voltage Vread3 and the verify voltage Vvfy32) (see FIG. 9) are detected, step S340 executes a program operation (i.e., secondary program operation) for the detected memory cells. After the program operation is executed, a verify read operation is executed while the verify voltage Vvfy32 acting as a read voltage is applied to the selected wordline WL(n−1) (S350). A determination is made at step S360 whether the detected memory cells are programmed to have a threshold voltage corresponding to the verify voltage Vvfy32. When the determination result is that all the detected memory cells are not programmed with a required threshold voltage, step S370 increases a program voltage to be applied to a selected wordline increases by a predetermined increment (S370). This routine proceeds to step S340, which is repeated until the program loop defined by steps S340-S370 are repeated a predetermined number of times or the memory cells are all programmed.

When the determination result is that all the detected memory cells are programmed with the required threshold voltage, a secondary program operation is executed for programmed memory cells connected with the wordline WL(n−1) and odd-number bitlines BLo0-BLo(n−1). This is conducted the same as described above and will not be described in further detail.

Figure 3:
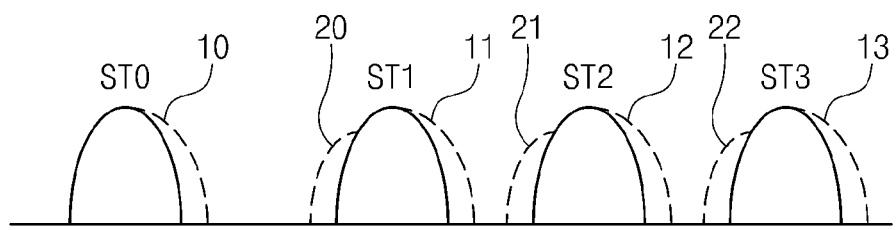
FIG. 3 illustrates widened threshold voltage distributions which are widened due to high temperature stress (HTS).
Figure 10:
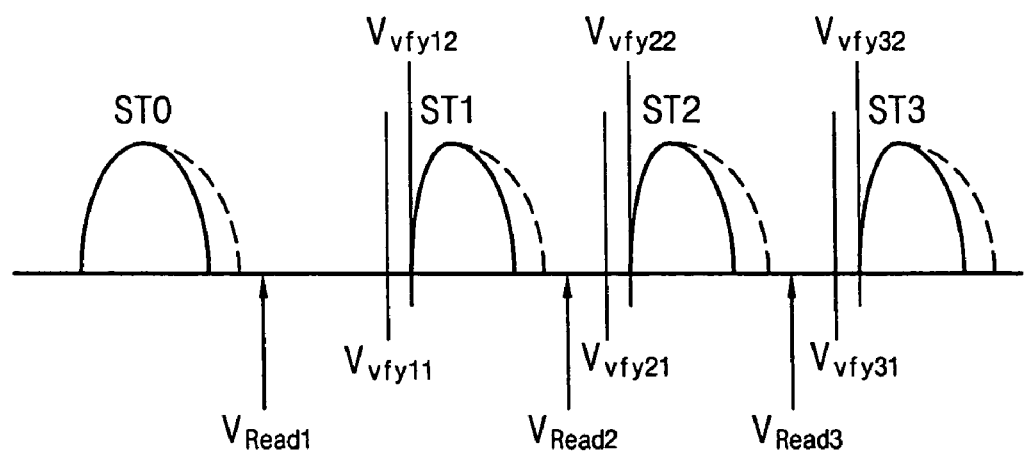
FIG. 10 illustrates threshold voltage distributions after executing a program operation of a flash memory device according to the present invention.

FIG. 10 illustrates threshold voltage distributions after a program procedure according to the present invention is ended. In a threshold voltage distribution corresponding to a state ST1, memory cells between verify voltages Vvfy11 and Vvfy12 (or a read voltage Vread1 and the verify voltage Vvfy12) are programmed to have the verify voltage Vvfy12 or a voltage higher than the verify voltage Vvfy12. As shown in FIG. 9 and FIG. 3, a margin between states ST0 and ST1 increases. In a threshold voltage distribution corresponding to a state ST2, memory cells existing between verify voltages Vvyf21 and Vvfy22 (or read and verify voltages Vread2 and Vvfy22) are programmed to have the verify voltage Vvfy22 or a voltage higher than the verify voltage Vvfy22. As shown in FIG. 1 and FIG. 3, a margin between states ST1 and ST2 increases. Similarly, in a threshold voltage distribution corresponding to a state ST3, memory cells existing between verify voltages Vvyf31 and Vvfy32 (or read and verify voltages Vread3 and Vvfy32) are programmed to have the verify voltage Vvfy32 or a voltage higher than the verify voltage Vvfy32. As shown in FIG. 10 and FIG. 3, a margin between states ST2 and ST3 increases. Namely, a read margin between adjacent states increases more than a read margin illustrated in FIG. 3. Thus, although a threshold voltage distribution is widened due to an electric field coupling/F-poly coupling and HTS, a read margin between adjacent states may be sufficiently secured using the program method according to the present invention.

Figure 11:
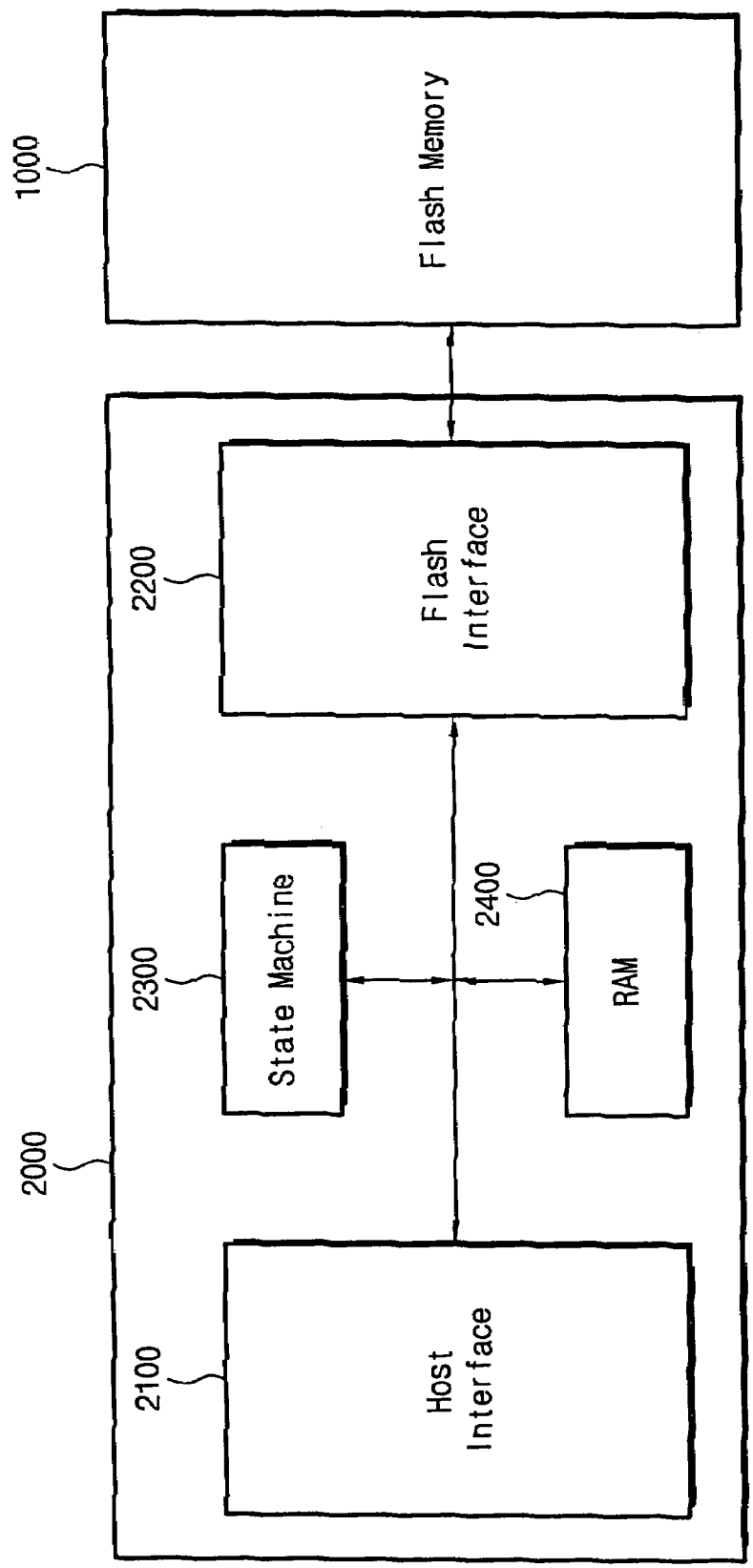
FIG. 11 is a block diagram of a memory system according to the present invention.

FIG. 11 is a block diagram of a memory system according to the present invention. The memory system includes a flash memory 1000 and a memory controller 2000. The flash memory 1000 is substantially identical to that illustrated in FIG. 4. Moreover, flash memory device 1000 is configured to execute a program operation according to the above-described program method.

Memory controller 2000 includes a host interface 2100, a flash interface 2200, a state machine 2300, and a RAM 2400. Host interface 2100 is configured to provide an interface with a host (not shown), and flash interface 2200 is configured to provide an interface with flash memory 1000. Program data provided from the host are temporarily stored in RAM 2400 through host interface 2100. The program data stored in RAM 2400 are transferred to flash memory 1000 through flash interface 2200 under the control of state machine 2300.

The state machine 2300 is configured to determine whether all program data provided from the host are stored in flash memory 1000. If the program data includes a plurality of page data, the page data are sequentially programmed into rows of a selected memory block. A page or a wordline in which final page data (hereinafter referred to as "final program data") is called "a final wordline". It is noted that the final wordline does not indicate a last wordline of a memory block. The final wordline may be one of a plurality of wordlines of the selected memory block. If the program data are all stored in flash memory 1000, state machine 2300 controls the execution of a primary program operation for a wordline disposed directly on the final wordline. For example, if the program data are all stored in flash memory 1000, state machine 2300 outputs a dummy program command and an address to flash memory 1000 through flash interface 2200. The address output from state machine 2300 is an address for addressing a wordline disposed directly on the final wordline. In response to the dummy program command and the address from memory controller 2000, flash memory 1000 executes a primary program operation for memory cells (e.g., memory cells of an even-number page) of a wordline (i.e., a wordline disposed directly on the final wordline) corresponding to an input address. If the primary program operation is completed, flash memory 1000 executes a secondary program operation for memory cells of the final wordline according to the same method as described above.

Program data to be stored in flash memory 1000 is stored under the control of memory controller 2000. At this point, flash memory 1000 automatically executes the primary and secondary program operations according to methods described in detail above. The primary and secondary program operations are substantially identical to those described above and will not be described in further detail. If the program data are all stored in the flash memory 1000, the memory controller 2000 outputs the dummy program command and the address to the flash memory 1000. The address, which is provided together with the dummy program command, is an address for selecting a wordline disposed directly on the final wordline.

Flash memory 1000 executes a primary program operation for a wordline corresponding to an input address in response to the dummy program command provided from memory controller 2000. The primary program operation is executed to maintain an erased state of the respective memory cells. Namely, the program operation is executed while page buffers of a register block 120 are initialized. In other words, the program operation is executed to enable memory cells of a selected wordline to be maintained at an erased state. In this case, the primary program operation is ended through a single program loop. If the first program operation based on the dummy program command is ended, flash memory 1000 executes a secondary program operation for a final wordline (or an even-number page of the final wordline and/or even- and odd-number pages). The secondary program operation for the final wordline is substantially identical to that described above and will not be described in further detail. In this manner, the program data transferred from the host are stored in memory cells of a wordline disposed directly on a wordline subjected to the primary wordline.

According to the present invention, after being subjected to a primary program operation, memory cells arranged within a specific region of respective states are subjected to a secondary program operation to have a threshold voltage equivalent to or higher than a verify voltage of the primary program operation. Thus, although a threshold voltage distribution is widened due to an electric field coupling/F-poly coupling and HTS, a read margin between adjacent states may be sufficiently secured using the program method according to the present invention.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A memory system comprising:
a flash memory having a memory cell array storing program data including a final data, the flash memory being configured to execute a first program operation on a selected wordline, and then execute a second program operation on an adjacent word line disposed directly adjacent to the selected word line; and
a memory controller configured to determine whether all of the program data are stored in the flash memory by the first and second program operations, such that when it is determined that all of the program data are stored in the flash memory, the memory controller outputs a dummy program command and a dummy address, thereby causing the flash memory to execute a dummy program operation,
wherein after executing the dummy program operation on a wordline identified by the dummy address, the flash memory is further configured to execute the second program operation on a final wordline corresponding to the final data of the program data.

2. The memory system of claim 1, wherein the memory controller comprises:
a host interface configured to receive the program data from a host;
a temporary storage device communicating with the host interface and temporarily storing the program data;
a flash memory interface communicating with the temporary storage device and the flash memory, the flash interface transferring the program data to the flash memory from the temporary storage device; and
a state machine communicating with the flash interface and the temporary storage device, the state machine controlling the transfer of program data to the flash memory from the temporary storage device.

3. The memory system of claim 2, wherein the state machine is further configured to determine whether all the program data provided from the host are stored in the flash memory.

4. The memory system of claim 2, wherein the state machine is further configured to control execution of the dummy program operation in response to the dummy program command.

5. The memory system of claim 2, wherein the state machine is further configured to output the dummy program command and the dummy address via the flash memory interface.

6. The memory system of claim 1, wherein the flash memory is further configured to execute the dummy program operation to enable memory cells connected to the wordline identified by the dummy address in order to maintained the memory cells in an erased state.

7. The memory system of claim 1, wherein the flash memory comprises first and second bitlines connected to a plurality of memory cells storing multi-bit data indicating one of a plurality of states.

8. The memory system of claim 7, wherein the second program operation comprises:
(a) reprogramming programmed memory cells connected to the adjacent word line and the first bitlines; and
(b) reprogramming programmed memory cells connected to the adjacent wordline and the second bitlines.

9. The memory system as recited in claim 8, wherein (a) reprogramming programmed memory cells connected to the adjacent wordline and the first bitlines comprises:
detecting programmed memory cells arranged within a predetermined region of a threshold voltage distribution where the programmed memory cells of the respective states are distributed,
wherein the predetermined region of the respective states is selected by one of a first verify voltage and a read voltage and a second verify voltage, the first verify voltage being lower than the second verify voltage and higher than the read voltage; and
programming the detected memory cells to have a second verify voltage corresponding to the respective states and a voltage higher than the second verify voltage.

10. The memory system as recited in claim 8, wherein (b) reprogramming programmed memory cells connected to the adjacent wordline and the second bitlines comprises:
detecting programmed memory cells arranged within a predetermined region of a threshold voltage distribution where the programmed memory cells of the respective states are distributed,
wherein the predetermined region of the respective states is selected by one of a first verify voltage and a read voltage and a second verify voltage, the first verify voltage being lower than the second verify voltage and higher than the read voltage; and
programming the detected memory cells to have a second verify voltage corresponding to the respective states and a voltage higher than the second verify voltage.

* * * * *